(12) United States Patent
Nakabayashi et al.

(10) Patent No.: US 8,491,719 B2
(45) Date of Patent: Jul. 23, 2013

(54) SILICON CARBIDE SINGLE CRYSTAL, SILICON CARBIDE SINGLE CRYSTAL WAFER, AND METHOD OF PRODUCTION OF SAME

(75) Inventors: Masashi Nakabayashi, Futtsu (JP); Tatsuo Fujimoto, Futtsu (JP); Mitsuru Sawamura, Futtsu (JP); Noboru Ohtani, Futtsu (JP)

(73) Assignee: Nippon Steel & Sumitomo Metal Corporation, Tokyo (JP)

( * ) Notice: Subject to any disclaimer, the term of this patent is extended or adjusted under 35 U.S.C. 154(b) by 1058 days.

(21) Appl. No.: 12/455,243

(22) Filed: May 29, 2009

(65) Prior Publication Data

US 2009/0255458 A1 Oct. 15, 2009

Related U.S. Application Data

(62) Division of application No. 10/589,680, filed as application No. PCT/JP2004/019812 on Dec. 27, 2004, now Pat. No. 7,794,842.

(51) Int. Cl.
*C30B 23/00* (2006.01)

(52) U.S. Cl.
USPC ............. 117/109; 117/84; 117/88; 117/951

(58) Field of Classification Search
USPC ..................... 117/84, 88, 109, 951
See application file for complete search history.

(56) References Cited

U.S. PATENT DOCUMENTS

| | | | |
|---|---|---|---|
| 5,119,540 A | | 6/1992 | Kong et al. |
| 5,611,955 A * | | 3/1997 | Barrett et al. ............ 252/62.3 C |
| 5,856,231 A | | 1/1999 | Niemann et al. |
| 5,895,526 A * | | 4/1999 | Kitoh et al. ..................... 117/84 |
| 6,056,820 A * | | 5/2000 | Balakrishna et al. ......... 117/200 |
| 6,218,680 B1 | | 4/2001 | Carter et al. |
| 6,522,080 B1 | | 2/2003 | Faillon et al. |
| 6,639,247 B2 * | | 10/2003 | Carter et al. .................... 257/77 |
| 2001/0023945 A1 | | 9/2001 | Carter et al. |
| 2002/0048526 A1 * | | 4/2002 | Nakamura et al. .............. 419/14 |

(Continued)

FOREIGN PATENT DOCUMENTS

| EP | 2 182 100 A2 | 5/2010 |
|---|---|---|
| JP | 9-500861 | 1/1997 |

(Continued)

OTHER PUBLICATIONS

Jenny et al. "Deep Level Transient spectroscopic and Hall Effect Investigation of the position of The Vanadium Acceptor Level in 4H and 6H-SiC", Applied Physics Letters, vol. 68, Issue 14, Apr. 1996, pp. 1963-1965.*

(Continued)

*Primary Examiner* — Matthew Song
(74) *Attorney, Agent, or Firm* — Kenyon & Kenyon LLP (57) ABSTRACT

The present invention provides a high resistivity, high quality, large size SiC single crystal, SiC single crystal wafer, and method of production of the same, that is, a silicon carbide single crystal containing uncompensated impurities in an atomic number density of $1\times10^{15}/cm^3$ or more and containing vanadium in an amount less than said uncompensated impurity concentration, silicon carbide single crystal wafer obtained by processing and polishing the silicon carbide single crystal and having an electrical resistivity at room temperature of $5\times10^3$ Ωcm or more, and a method of production of a silicon carbide single crystal.

8 Claims, 1 Drawing Sheet

U.S. PATENT DOCUMENTS

| | | |
|---|---|---|
| 2002/0104478 A1 | 8/2002 | Oguri |
| 2002/0189536 A1* | 12/2002 | Otsuki et al. .................. 117/109 |
| 2003/0232001 A1* | 12/2003 | Fujita ........................ 423/445 R |
| 2003/0233975 A1 | 12/2003 | Jenny et al. |

FOREIGN PATENT DOCUMENTS

| | | |
|---|---|---|
| JP | 10067600 A | 3/1998 |
| JP | 2003104798 A | 4/2003 |
| JP | 2005041710 A | 2/2005 |
| WO | WO 95/04171 | 2/1995 |
| WO | WO 2006/041067 A1 | 4/2006 |

OTHER PUBLICATIONS

European Search Report dated Aug. 24, 2011 in Application No. EP 04 80 8162, 5 pages.

Yu. M. Tairov et al. "General Principles of Growing Large-Size Single Crystals of Various Silicon Carbide Polytypes" Journal of Crystal Growth 52 (1981) 146-150.

S.A. Reshanov et al., "Features of Semi-Insulating SiC Single-Crystal Growth by Physical Vapor Transport" Materials Science Forum vols. 353-356 (2001) pp. 53-56.

M. Bickermann et al., "On the Preparation of Vanadium-Doped Semi-Insulating SiC Bulk Crystals" Materials Science Forum vols. 389-393 (2002) pp. 139-142.

M.E. Zvanut et al. "The level position of a deep intrinsic defect in 4H-SiC studied by photoinduced electron paramagnetic resonance." Applied Physics Letters. vol. 80, No. 3. Jan. 21, 2002 pp. 410-412.

B. Magnusson et al. "Properties of the UD-1 Deep-Level Center in 4H-SiC" Materials Science Forum vols. 389-393 (2002) pp. 505-508.

K. Rammohan et al., "Gallium Nitride: A Material Opportunity" Rutberg & Co.. 2001, pp. 1-53.

Yasuhiro Hayakawa et al., "Scientific Investigation on a grade and color treatment of the silver coin of the Edo period" IMES: Institute for Monetary and Economic Studies Bank of Japan, Discussion Paper No. 2001-J-14 [with partial English translation].

* cited by examiner

SILICON CARBIDE SINGLE CRYSTAL, SILICON CARBIDE SINGLE CRYSTAL WAFER, AND METHOD OF PRODUCTION OF SAME

This application is a divisional application under 35 U.S.C. §120 and §121 of prior application Ser. No. 10/589,680 filed Aug. 16, 2006, now U.S. Pat. No. 7,794,842, which is a 35 U.S.C. §371 of International Application No. PCT/JP2004/019812 filed Dec. 27, 2004, wherein PCT/JP2004/019812 was filed and published in the Japanese language.

TECHNICAL FIELD

The present invention relates to a high resistivity silicon carbide single crystal, a silicon carbide single crystal wafer, and a method of production of the same, in particular relates to a high crystal quality silicon carbide single crystal, silicon carbide single crystal wafer, and a method of production of the same used for a substrate of a high frequency electronic device.

BACKGROUND ART

Silicon carbide (SiC) is high in heat resistance and mechanical strength and further exhibits excellent physical and chemical properties such as resistance to radiation and is therefore coming under attention as an environment-resistant semiconductor material. Further, in recent years, demand for SiC single crystal as a substrate material for a blue to ultraviolet short wavelength optical device, high frequency high voltage resistance electronic device, etc. has been rising. In applications of SiC single crystals to the semiconductor field, high quality single crystal having a large area is sought. In particular, in applications for substrates of high frequency devices etc., in addition to the quality of the crystal, possession of a high electrical resistance is sought.

In the past, on the laboratory scale, for example, SiC single crystal of a size enabling fabrication of a semiconductor chip has been obtained by the sublimation recrystallization method (Lely method). However, with this method, the obtained single crystal is small in area and not easy to control in its dimensions and shape and further in its crystal polytypes or impurity carrier concentration. On the other hand, another practice has been to use the chemical vapor deposition method (CVD method) for heteroepitaxial growth on a silicon (Si) or other different type of substrate so as to grow a cubic silicon carbide single crystal. With this method, a large area single crystal is obtained, but the lattice mismatch with the Si substrate is as high as about 20% etc., so it is only possible to grow an SiC single crystal including numerous defects (up to $10^7$ cm$^{-2}$) and it is not easy to obtain a high quality SiC single crystal. To solve these problems, the improved Lely method of using an SiC single crystal wafer as a seed crystal for sublimation recrystallization has been proposed (Yu. M. Tairov and V. F. Tsvetkov, *J. Crystal Growth*, vol. 52 (1981), pp. 146 to 150). If using this improved Lely method, it is possible to grow an SiC single crystal while controlling the crystal polytype (6H type, 4H type, 15R type, etc.) and the shape, carrier type, and concentration of the SiC single crystal. At the present time, SiC single crystal wafers of a size of 2 inch (50 mm) to 3 inch (75 mm) are being cut from SiC single crystal prepared by the improved Lely method and used for fabrication of devices in the electronics field etc.

On the other hand, in recent years, as a material for high frequency semiconductor devices, gallium nitride (GaN) having properties superior even to silicon (Si) or gallium arsenic (GaAs) is coming under attention (Rutberg & Co., *Gallium Nitride: A Material Opportunity* (2001)). In the fabrication of a GaN device, it is necessary to form a GaN single crystal thin film on some sort of single crystal substrate. As one general type of such a substrate, there is a sapphire substrate. Sapphire has the merit of enabling the stable supply of relatively good quality single crystal, but has a large difference in lattice constant from GaN of 13.8%, so easily induces a deterioration of the quality of the thin film formed on it. Further, the thermal conductivity is a small 0.42 W/cm·K, so there is also a problem in the point of dissipation of heat at the time of device operation. A GaN high frequency device formed on a sapphire substrate cannot currently be said to fully realize the inherent performance of GaN in quality and operating properties. As opposed to this, an SiC single crystal has a small difference of lattice constant with GaN of 3.4%, so a good quality GaN thin film can be formed. The thermal conductivity is also a large 3.3 W/cm·K, so the cooling efficiency is also high. Compared with sapphire and other conventional substrates, a great improvement in the properties of GaN devices can be expected. Therefore, in recent years, expectations have become very high for SiC single crystal substrates even in this field.

In high frequency device applications of the above-mentioned substrate, in addition to the quality of the crystal, reduction of the parasitic capacity of the chips fabricated on it and separation of the chips require that the substrate be raised in resistivity (to at least $5\times10^3$ Ωcm, preferably at least $1\times10^5$ Ωcm).

At the present time, such SiC high resistivity substrates are being industrially obtained by forming deep levels in the bandgap of the SiC single crystal by some sort of method. For example, it is known that vanadium forms deep levels in the SiC crystals in either the donor or acceptor state, compensates for a shallow donor or shallow acceptor impurity, and raises the crystal's resistivity. Specifically, for example, as shown in S. A. Reshanov et al., *Materials Science Forum*, vols. 353 to 356 (2001), pp. 53 to 56, in the above-mentioned sublimation recrystallization method, the SiC crystal powder material has added to it metal vanadium or a vanadium compound (silicate, oxide, etc.) which is made to sublimate together with the SiC material and thereby obtain a vanadium-doped crystal. However, the thus prepared SiC single crystal has a high resistivity, but is poor in crystal quality. Further, the crystal locations having a high resistivity constitute only extremely limited parts in the grown crystal.

Further, Japanese National Publication No. 9-500861 discloses the art of obtaining a higher resistivity vanadium-doped crystal. This art overcompensates for the impurity nitrogen in the SiC by addition of an element having a trivalent shallow acceptor level and changes the conductivity type from the n type to the p type to set the vanadium or other transition metal at the donor level and thereby obtain a high resistivity. However, even in the art of this publication, the problem of the vanadium concentration becoming uneven cannot be avoided. Even with this art, the inherent problems of crystal quality or yield in vanadium-doped crystals are not solved. Further, adding the acceptor element while controlling it to give the optimum concentration in the SiC crystal is difficult technically. Further, the concentration of the impurity nitrogen mixed into the SiC crystal in the sublimation recrystallization method generally changes during the growth by several orders of magnitude, so maintaining the optimum acceptor element concentration in the entire region of the SiC single crystal ingot can be said to be extremely difficult. For this reason, situations easily arise where a shortage of the acceptor element makes converting the crystal in conductivity type to the desired p type impossible or alternatively excessive addition of the acceptor element makes the crystal become an extreme p type and makes compensation by vanadium difficult. The art of this publication also does not solve the inherent problems of crystal quality and yield in vanadium-doped crystals.

The solid solution limit of vanadium to SiC is about 3 to $5\times10^{17}/cm^3$ or so. If the amount of vanadium exceeds the solid solution limit, as described in M. Bickermann et al., *Materials Science Forum*, vols. 389 to 393 (2002) pp. 139 to 142, there is the problem that a precipitate forms and the crystal quality drops. The amount of addition of vanadium is also restricted due to this reason, so in the prior art, high resistivity vanadium-doped crystal was difficult to produce.

On the other hand, it is also known that by reducing the concentration of the carrier impurity of the SiC single crystal down to a certain extremely low level, the crystal becomes high in resistivity. This is because the point defects of the deep levels present in the bandgap of the SiC crystals, called ID, UD-1, carbon vacancy, etc. trap the conductive electrons or holes (for example, M. E. Zvanut and V. V. Konovalov, *Applied Physics Letters*, Vol. 80, No. 3, pp. 410 to 412 (2002), B. Magnussen et al., *Materials Science Forum*, vols. 389 to 393 (2002) pp. 505 to 508). However, even the quality of the thus obtained high resistivity single crystal does not satisfy the high requirements of the semiconductor field at the present time.

DISCLOSURE OF THE INVENTION

In the above explained prior art, when adding vanadium so as to try to raise the SiC single crystal in resistivity, the vanadium concentration in the crystal has to be made higher than the uncompensated impurity concentration (|n type impurity concentration other than vanadium−p type impurity concentration other than vanadium|). That is, to obtain a high resistivity vanadium-doped crystal, the vanadium concentration has to be controlled so that the uncompensated impurity concentration<vanadium concentration<vanadium solid solution limit (3 to $5\times10^{17}/cm^3$). However, the concentration of uncompensated impurities of an SiC single crystal is often $1\times10^{17}/cm^3$ or more. The above-mentioned conditions are extremely narrow in allowable range. Further, vanadium has a sublimation or evaporation speed higher than the sublimation speed of an SiC material, so changes in the vanadium concentration during growth cause the grown SiC crystal to have regions where the vanadium concentration exceeds the solid solution limit and regions where it is below the uncompensated impurity concentration. For this reason, there were the problems that conventional vanadium-doped crystal was low in crystal quality and the crystal locations having a high resistivity were only limited locations of the grown crystal.

On the other hand, lowering the carrier impurity concentration to raise the SiC single crystal in resistivity requires the crystal to be increased in purity to a high level. For this reason, in addition to the use of a special material, high temperature growth and other special processes become necessary. These are disadvantageous cost-wise. Further, compared with the usual single crystal growth methods, control of the crystal growth is remarkably difficult, so a high quality crystal cannot be obtained. This point has been a problem.

The present invention solves this problem and provides a high resistivity, high quality, large size SiC single crystal and SiC single crystal wafer and a method of production of the same. The inventors engages in various studies and research for solving this problem and as a result discovered that it is possible to make a crystal high in resistivity by an amount of addition of vanadium far smaller than the past and thereby provide a high quality and high resistivity SiC single crystal. The present invention is configured as follows:

(1) A silicon carbide single crystal containing an uncompensated impurity in an atomic number density of at least $1\times10^{15}/cm^3$ and containing vanadium in less than a concentration of said uncompensated impurity.

(2) A silicon carbide single crystal as set forth in (1), wherein said uncompensated impurity has a concentration of not more than $1\times10^{17}/cm^3$.

(3) A silicon carbide single crystal as set forth in (1), wherein said uncompensated impurity has a concentration of not more than $5\times10^{16}/cm^3$.

(4) A silicon carbide single crystal as set forth in any one of (1) (to (3), wherein said uncompensated impurity gives a conductivity type of an n type.

(5) A silicon carbide single crystal as set forth in (1), wherein said vanadium has a concentration of at least $5\times10^{14}/cm^3$.

(6) A silicon carbide single crystal as set forth in (1), wherein said vanadium has a concentration of not less than $1\times10^{15}/cm^3$.

(7) A silicon carbide single crystal as set forth in (1), wherein said vanadium has a concentration of not less than $1\times10^{16}/cm^3$.

(8) A silicon carbide single crystal as set forth in any one of (1) to (7), wherein the difference in concentration of said uncompensated impurity and said vanadium is not more than $1\times10^{17}/cm^3$.

(9) A silicon carbide single crystal as set forth in any one of (1) to (7), wherein the difference in concentration of said uncompensated impurity and said vanadium is not more than $5\times10^{16}/cm^3$.

(10) A silicon carbide single crystal as set forth in any one of (1) to (7), wherein the difference in concentration of said uncompensated impurity and said vanadium is not more than $1\times10^{16}/cm^3$.

(11) A silicon carbide single crystal as set forth in any one of (1) to (10), wherein said silicon carbide single crystal has a main polytype of 3C, 4H, or 6H.

(12) A silicon carbide single crystal as set forth in any one of (1) to (10), wherein said silicon carbide single crystal has a main polytype of 4H.

(13) A silicon carbide single crystal wafer obtained by processing and polishing a silicon carbide single crystal as set forth in any one of (1) to (12), wherein said wafer has an electrical resistivity at room temperature of at least $5\times10^3$ Ωcm.

(14) A silicon carbide single crystal wafer obtained by processing and polishing a silicon carbide single crystal as set forth in any one of (1) to (12), wherein said wafer has an electrical resistivity at room temperature of not less than $1\times10^5$ Ωcm.

(15) A silicon carbide single crystal wafer as set forth in (13) or (14), wherein said silicon carbide single crystal wafer at room temperature is a single polytype of 3C, 4H, or 6H.

(16) A silicon carbide single crystal wafer as set forth in (13) or (14), wherein said silicon carbide single crystal wafer is comprised of a single polytype of 4H.

(17) A silicon carbide single crystal as set forth in any one of (13) to (16), wherein said wafer has a size of at least 50 mm.

(18) A silicon carbide single crystal as set forth in any one of (13) to (16), wherein said wafer has a size of at least 100 mm.

(19) An epitaxial wafer comprised of a silicon carbide single crystal as set forth in any one of (13) to (18) on the surface of which a silicon carbide thin film is grown.

(20) An epitaxial wafer comprised of a silicon carbide single crystal as set forth in any one of (13) to (18) on the surface of which a gallium nitride, aluminum nitride, or indium nitride thin film or mixed crystal thin film of the same is grown.

(21) A method of production of a silicon carbide single crystal by using a sublimation recrystallization method using a seed crystal to grown a single crystal, said method of production of a silicon carbide single crystal characterized by using a sublimating material comprised of silicon carbide and vanadium or a vanadium compound in a mixture and using for the crystal growth a graphite crucible having a nitrogen concentration of not more than 50 ppm as measured by an inert gas fusion thermal conductivity method.

(22) A method of production of a silicon carbide single crystal as set forth in (21), wherein said graphite crucible has a nitrogen concentration of not more than 20 ppm.

(23) A method of production of a silicon carbide single crystal as set forth in (21), wherein said graphite crucible has a nitrogen concentration of not more than 10 ppm.

(24) A method of production of a silicon carbide single crystal as set forth in any one of (21) to (23), wherein said graphite crucible is a graphite crucible treated for purification by being held in an inert gas atmosphere of a pressure of not more than 1.3 Pa at a temperature of 1400° C. or more for 10 hours to less than 120 hours.

(25) A method of production of a silicon carbide single crystal as set forth in any one of (21) to (23), further comprising charging the graphite crucible with a material powder mainly comprised of silicon carbide and, in that state, treating the graphite crucible for purification by holding it in an inert gas atmosphere at a pressure of not more than 1.3 Pa at a temperature of 1400 to 1800° C. for 10 hours to less than 120 hours, placing said graphite crucible and seed crystal in an inert gas atmosphere adjusted in pressure to $1.3\times10^2$ to $1.3\times10^4$ Pa, and heating to 2000° C. or more, then starting crystal growth.

(26) A method of production of a silicon carbide single crystal as set forth in (24) or (25), wherein said purification treatment is performed at a pressure of $1.3\times10^{-1}$ Pa or less.

(27) A method of production of a silicon carbide single crystal as set forth in (24) or (25), wherein said purification treatment is performed at a pressure of $6.5\times10^{-2}$ Pa or less.

(28) A method of production of a silicon carbide single crystal as set forth in any one of (24) to (27), wherein after said purification treatment, said graphite crucible is used for crystal growth without being exposed to the atmosphere.

The SiC single crystal of the present invention realizes a higher resistivity by a far smaller amount of vanadium than the past, less than the concentration of the uncompensated impurities. This is believed to be caused by the vanadium and deep level defects being simultaneously present in the SiC single crystal. As a result, there are no longer problems of the past of excessive addition of vanadium causing precipitates and inducing deterioration of the crystal quality, and a high resistivity can be realized. At the same time, no process for superhigh purification of the SiC single crystal—which was accompanied by remarkable difficulties industrially—is needed, so an excessive increase in manufacturing costs can be avoided.

In this way, the novel point in the present invention is the simultaneous introduction of vanadium and deep level defects, which was never done together before, into the SiC single crystal and thereby the acquisition of special effects far greater than expected from the effects in the case of introduction of these independently. Note that the present invention is not limited by the mechanism of expression of the above-mentioned high resistivity.

BEST MODE FOR WORKING THE INVENTION

In the SiC single crystal of the present invention, the concentration of the uncompensated impurities is preferably $1\times10^{17}/cm^3$ or less, more preferably $5\times10^{16}/cm^3$ or less. The lower limit value of the vanadium concentration is $5\times10^{14}/cm^3$ or more, preferably $1\times10^{15}/cm^3$ or more, more preferably $1\times10^{16}/cm^3$ or more, while the upper limit value is the above-mentioned concentration of uncompensated impurities. By making the uncompensated impurity concentration and vanadium concentration in the SiC single crystal the above-mentioned values, an effective complex effect of vanadium and deep level defects is obtained and the crystal is made high in resistivity. If the concentration of uncompensated impurities in the crystal exceeds $1\times10^{17}/cm^3$ or if the concentration of vanadium does not reach $5\times10^{14}/cm^3$, the complex effect of the deep level defects and vanadium does not become greater enough to compensate for the impurity and making the SiC single crystal high in resistivity becomes remarkably difficult.

Further, by making the difference in concentration between the uncompensated impurity concentration and vanadium concentration in the SiC single crystal $1\times10^{17}/cm^3$ or less, preferably $5\times10^{16}/cm^3$ or less, more preferably $1\times10^{16}/cm^3$ or less, the vanadium and deep level defects become superior over the uncompensated impurity, and the SiC single crystal can effectively be made high in resistivity. The type of the uncompensated impurity is not particularly alluded to, but a typical impurity of SiC is the donor element nitrogen. When producing an SiC single crystal by the sublimation recrystallization method, in general the grown crystal most often has a conductivity type of the n type.

When trying to convert the conductivity type to the p type, boron or aluminum or another acceptor element has to be added to the SiC single crystal, but avoiding a shortage of the amount of addition or excessive addition and producing a p type SiC single crystal of the optimum uncompensated impurity concentration is difficult. In the present invention, there is no need to convert the conductivity type to the p type. The art according to the present invention is more effective when applied to an n type SiC crystal. Compared with the concentration of the conditions for obtaining a high resistivity by vanadium in the prior art, the SiC single crystal of the present invention is low in vanadium concentration, so either no vanadium compound will precipitate in the SiC single crystal ingot as a whole or even if precipitating, will be limited to local regions, so the crystal quality can be kept high.

Simultaneously, the art according to the present invention enables the crystal to be made high in resistivity by a broader range of concentration of vanadium than the prior art, so all wafers obtained from an SiC single crystal ingot or the majority of the wafers can be made high resistivity wafers of $5\times10^3$ Ωcm or more, preferably $1\times10^5$ Ωcm or more. The SiC single crystal of the present invention can be produced by any polytype of 3C, 4H, and 6H for which application for devices is considered promising at present, but among these, in particular, the art of the present invention is most effectively applied to the 4H polytype for which high device properties can be expected but the amount of unavoidable nitrogen introduced is large. Further, if considering application as a device, the SiC single crystal wafer is preferably comprised of a single polytype of either 3C, 4H, or 6H.

As the SiC single crystal ingot for fabricating such a wafer, the ingot as a whole does not necessarily have to be a single polytype, but by making the main polytype of the ingot one of the above-mentioned polytypes, it is possible to improve the yield of the single polytype wafer.

The wafer is not particularly limited in size, but the present invention is particularly effective in large size SiC single crystal where the planar distribution of the dopant concentration easily becomes large. A large effect is obtained when the size of the single crystal becomes 50 mm or more, in particular 100 mm or more. The SiC single crystal wafer of the present invention has a high resistivity and further has a high crystal quality, so can be applied to a high operating frequency device. An epitaxial wafer fabricated by forming an SiC single crystal thin film on the present invention wafer by the CVD method etc. or an epitaxial wafer obtained by epitaxial growth of a thin film of gallium nitride, aluminum nitride, or indium nitride or a thin film of mixed crystals of these is good in crystallinity of the SiC wafer forming the substrate, so has superior properties (thin film surface morphology, electrical properties, etc.)

To produce the SiC single crystal of the present invention, it is possible to use a known single crystal growth method such as using vanadium metal or a silicate, carbide, or other vanadium compound as the source of vanadium, mixing this with the SiC material by a predetermined composition considering the intake efficiency, and producing the crystal by the sublimation recrystallization method. At that time, as the SiC material, a commercially available material may be used.

In the sublimation recrystallization method, to reduce the concentration of the uncompensated impurities, it is important to reduce the leading impurity, that is, nitrogen, of the SiC crystal. The inventors noticed that the concentration of nitrogen was often locally high near the seed crystal of an SiC single crystal grown by the sublimation recrystallization method and investigated the cause. As a result, they pinpointed the fact that the intermixture into the SiC signal crystal of the nitrogen given off from the mainly graphite crucible is one of the main factors behind the reduction of the purity. When using the sublimation recrystallization method using a seed crystal to produce the SiC single crystal of the present invention, by using a graphite crucible having a nitrogen concentration, as measured by the inert gas fusion thermal conductivity method, of 50 ppm or less, preferably 20 ppm or less, more preferably 10 ppm or less, it is possible to reduce the nitrogen introduced from the crucible into the SiC single crystal and reduce the uncompensated impurity concentration of the SiC single crystal.

Further, to obtain such a graphite crucible, it is possible to treat a graphite crucible for purification by holding it in an inert gas atmosphere at a temperature of 1400° C. or more for 10 hours to less than 120 hours. At that time, the inert gas atmosphere has a pressure of 1.3 Pa or less, preferably $1.3 \times 10^{-1}$ Pa or less, more preferably $6.5 \times 10^{-2}$ Pa or less. There is no upper limit on the treatment time, but if the treatment pressure exceeds 1.3 Pa or the treatment time is less than 1400° C., the nitrogen removal efficiency remarkably falls and the heating holding time becomes long, so demerits arise in terms of the manufacturing costs. The treatment temperature is also not particularly limited, but if the treatment temperature becomes 3000° C. or more, there would be problems in terms of the durability of the treatment system, so this is not preferable.

Further, the above treatment may be performed incorporated in the SiC crystal growth process. That is, in the sublimation recrystallization method using a seed crystal, the graphite crucible may be filled with a sublimating material mainly comprised of SiC and, in that state, may be held in an inert gas atmosphere at a pressure of 1.3 Pa or less, preferably $1.3 \times 10^{-1}$ Pa or less, more preferably $6.5 \times 10^{-2}$ Pa or less, at 1400° C. to 1800° C. in temperature for 10 hours to less than 120 hours so as to treat the graphite crucible for purification. At this time, if the pressure exceeds 1.3 Pa, the purification treatment cannot be performed efficiently. If the treatment temperature is under 1400° C. also, the purification treatment cannot be performed efficiently, while if over 1800° C., crystal growth ends up starting during the purification treatment resulting in the formation of polycrystals and making it impossible to realize normal signal crystal growth in the subsequent SiC single crystal growth process.

After this purification treatment, without opening the growth furnace to the atmosphere, the inert gas pressure is adjusted to $1.3 \times 10^2$ to $1.3 \times 10^4$ Pa and the crucible is heated to 2000° C. or more for causing SiC crystal growth. The crystal growth temperature is not particularly defined in upper limit, but if 3000° C. or more, there are problems in the durability of the growth system, so this is not preferable. Note that when not incorporating the graphite crucible purification treatment in the SiC crystal growth process, if exposing the graphite crucible treated for purification to the atmosphere, the graphite surface reabsorbs nitrogen from the atmosphere and the effect of the purification treatment ends up falling. To prevent the treated crucible from being exposed to the atmosphere, it is possible and more effective to make preparations such as filling the sublimating material inside a vacuum glove box filled with an inert gas so as to avoid the effects of reabsorption of nitrogen.

EXAMPLES

Below, examples will be used to explain the present invention more specifically.

Example 1 and Comparative Examples 1 to 3

Figure 1:
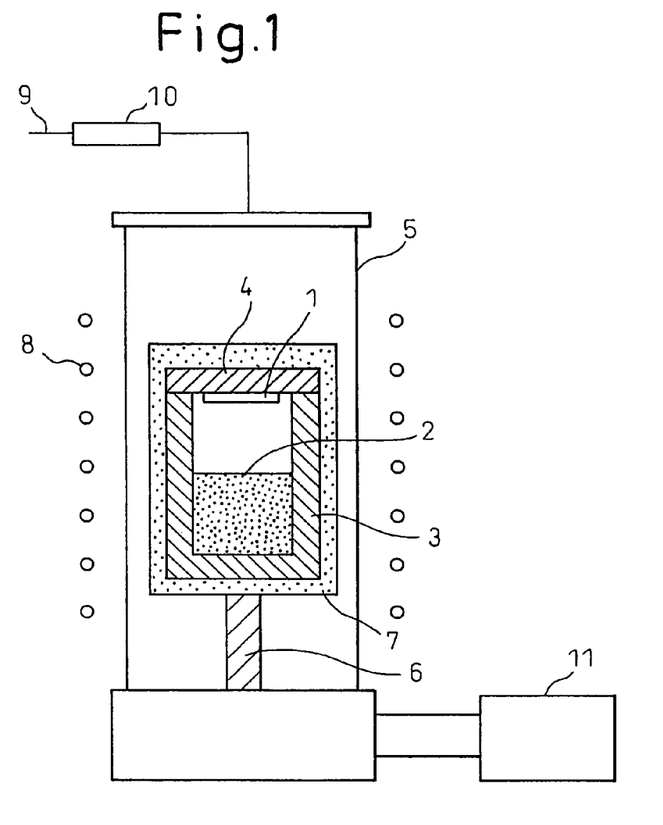
FIG. 1 is a view of the configuration of an example of a single crystal production system used for production of the crystal of the present invention.

Example 1 and Comparative Examples 1 to 3 were produced using the crystal growth system of FIG. 1. As the seed crystal, an SiC single crystal wafer having a size of 50 mm, having a (0001) face, and comprised of a single 4H polytype was prepared. The seed crystal 1 was attached to the inside of the graphite lid 4. As the sublimating material 2, for Example 1 and Comparative Example 1, a commercially available SiC crystal powder and vanadium compound in mixture were filled. The vanadium compound was mixed in by an amount giving, by vanadium atom conversion, a mass concentration in the sublimating material of 0.042%. For Comparative Examples 2 and 3, as sublimating materials, just commercially available SiC crystal powder was filled. Next, the crucible 3 filled with the material was closed by a graphite lid 4 equipped with the seed crystal, covered by graphite felt 7, then placed on a graphite support rod 6 and set inside a double wall quartz pipe 5 for crystal growth by the process shown below.

For Example 1 and Comparative Example 3, a crystal growth process including treatment of the graphite crucible for purification was used. The details were as follows: First, the inside of the quartz pipe 5 was evacuated to less than $1.0 \times 10^{-4}$ Pa, then, while continuing to evacuate it, current was run through the work coil 8 to raise the temperature of the graphite crucible to the purification treatment temperature of 1600° C. At this time, the internal pressure of the quartz pipe temporarily rose to 1.3 Pa or more, but while holding the temperature as was, the quartz pipe was evacuated to an internal pressure of the purification treatment pressure of $1.0 \times 10^{-1}$ Pa or less whereupon treatment was begun to remove the impurity nitrogen in the crucible. The treatment time was 48 hours. During that interval, the vacuum evacuation system 11 was operated to maintain the internal pressure of the quartz pipe at a value lower than the above-mentioned value.

After the end of the crucible purification treatment, as the atmospheric gas, high purity Ar gas of a purity of 99.9999% or more was run through the pipe 9 under the control of an Ar gas mass flow controller 10 and, while maintaining the pressure in the quartz pipe at the growth pressure of $1.3 \times 10^3$ Pa, the graphite crucible temperature was raised to the target temperature of 2400° C. Thereafter, growth was continued for about 20 hours. The temperature gradient in the crucible at this time was 14.5 to 15.5° C./cm, and the growth rate was about 0.8 to 0.9 mm/hour. The obtained crystal had a size of about 52 mm and a height of 16 mm in the case of the crystal of Example 1 and about 17 mm in the case of the crystal of Comparative Example 3.

For Comparative Example 1 and Comparative Example 2, the ordinary crystal growth process not including graphite crucible purification treatment was used for the crystal growth. The details were as follows. The inside of the quartz pipe was evacuated to $1.0 \times 10^{-4}$ Pa, then high purity Ar gas of a purity of 99.9999% or more was run through it. While holding the pressure in the quartz pipe at the growth pressure of $1.3 \times 10^3$ Pa, current was run through the work coil 8 to raise the temperature of the graphite crucible to 2400° C. After this, growth was continued for about 20 hours. At that time, the temperature gradient in the crucible was 14.5 to 15.5° C./cm and the growth rate was about 0.8 to 0.9 mm/hour. The obtained crystal had a size of about 52 mm and a height of 16 mm in the case of the crystal of Comparative Example 1 and about 18 mm in the case of the crystal of Comparative Example 2.

Before analyzing the obtained SiC single crystal, the graphite crucible treated for purification treatment was measured for its nitrogen concentration. First, a graphite crucible of the same material and same shape as that used for the crystal growth was used for treatment for purification in the same way as in Example 1 and Comparative Example 3 by holding it at a temperature of 1600° C. and a pressure of $1.0 \times 10^{-1}$ Pa or less for 48 hours. At this time, the graphite crucible was filled with a sublimating material. After the purification treatment, the graphite crucible was cooled. The crucible treated for purification in the vacuum glove box filled with an inert gas was cut to obtain a test piece of a diameter of about 5 mm and a length of 10 mm as a measurement test piece. The nitrogen concentration was then measured by the inert gas fusion thermal conductivity method. The measurement was conducted as follows.

First, the heating crucible in the analysis apparatus was run through by a large current in the state not filled with any sample. The inside of the heating crucible was held in the high temperature state of 2500° C. or more for 30 seconds to remove impurity nitrogen from the heating crucible surface and vicinity of the surface and make the measurement space sufficiently high in purity. The heating crucible was cooled, then a test piece kept standing outside the heating zone of the measurement system was moved into the heating crucible in a state not exposed to the atmosphere. The inside of the crucible was then held at a high temperature state of 2500° C. or more for 30 seconds. In this state, the nitrogen produced from the test piece was transported by helium carrier gas. The thermal conductivity of this mixed gas was measured to determine the nitrogen concentration. As a result of the measurement, the crucible treated for purification had a nitrogen concentration of about 9 ppm. Further, a graphite crucible not treated for purification was measured by a similar method. As a result, the nitrogen concentration was about 59 ppm.

The thus obtained SiC single crystals of Example 1 and Comparative Examples 1 to 3 were analyzed by X-ray diffraction and Raman scattering, whereby it could be confirmed that in all ingots, SiC single crystals of a mainly 4H polytype were grown. To measure the crystals for impurity concentration and resistivity, three wafers of thicknesses of 1 mm and sizes of 51 were fabricated from each grown single crystal ingot. The orientations of the wafers were exactly the (0001) faces. The vanadium concentration and impurity concentration in the wafer corresponding to the top, middle, and bottom (vicinity of seed crystal) of each grown crystal (distances from the surface of start of growth of the seed crystal to the wafer bottom surface of 12 mm, 8 mm, and 4 mm) were examined by secondary ion mass spectrometry (SIMS). According to R. G. Wilson et al., *Secondary Ion Mass Spectrometry: A Practical Handbook For Depth Profiling And Bulk Impurity Analysis* (1989), for analysis of vanadium, a lower limit of measurement of $1.5 \times 10^{14}/cm^3$ is obtained. In the present invention as well, analysis was performed by a method based on this. The lower limit of measurement of vanadium was less than $5 \times 10^{14}/cm^3$. The room temperature resistivities of the wafers were examined by the Van der Pauw method. From the above analyses, the results shown in Tables 1 to 4 were obtained.

The uncompensated impurity concentration of the crystal of Example 1 (Table 1) was 1.65 to $2.24 \times 10^{16}/cm^3$. The main ingredient of the impurities was the donor element nitrogen. The conductivity due to the impurity was the n type. The nitrogen concentration after subtracting the compensation by the impurity acceptor element was the uncompensated impurity concentration. Due to the purification treatment of the graphite crucible, compared with Comparative Example 1 and Comparative Example 3, the drop in nitrogen concentration, in particular at the bottom of the ingot, was remarkable, so the uncompensated impurity concentration also fell. The vanadium concentration was lower than the above-mentioned uncompensated impurity concentration, that is, $3.99 \times 10^{15}$ to $3.87 \times 10^{16}/cm^3$. The concentration of vanadium in the ingot as a whole did not exceed the solid solution limit, so no precipitate was formed and the crystallinity was excellent. On the other hand, in all of the wafers at the top and bottom, the resistivity was a high one of $10^{10}$ Ωcm or more.

Comparative Example 1 (Table 2) is a crystal having a vanadium concentration substantially the same as the invention example, but in particular does not utilize the technique of removal of impurities, so the uncompensated impurity concentration is high. The main ingredient of the impurities is nitrogen, and the conductivity due to the uncompensated impurity is the n type. In particular in the region of the start of growth at the bottom of the ingot, the effect of the nitrogen produced from the graphite crucible is great. The uncompensated impurity concentration becomes $1 \times 10^{18}/cm^3$ or more. The resistivity is a low one of less than $1 \times 100$ Ωcm throughout the ingot.

Comparative Example 2 (Table 3) is a crystal in which no vanadium was mixed with the sublimating material. The main impurity is nitrogen, and the conductivity due to the uncompensated impurity is the n type. Like in Example 1, the technique of treatment of the graphite crucible for purification is introduced, so the amount of nitrogen mixed in is reduced and the uncompensated impurity concentration is within the range of the present invention, but vanadium is not added, so the resistivity is less than $1\times10^3$ Ωcm. Compared with Comparative Example 1, the resistivity is high, but does not reach the required high level.

Comparative Example 3 (Table 4) is a crystal not having vanadium mixed into the sublimating material and further not using art for reducing the impurity concentration. The concentration of the main impurity nitrogen is high in the ingot as a whole, in particular the bottom, the conductivity due to the uncompensated impurity is the n type, and the resistivity is a low one of less than $1\times10^0$ Ωcm through the ingot.

TABLE 1

Example 1

| | Uncompensated impurity concentration | Vanadium concentration | Room temperature resistivity |
|---|---|---|---|
| Top | $1.65 \times 10^{16}$ atom/cm$^3$ | $3.99 \times 10^{15}$/cm$^3$ | $3.21 \times 10^{11}$ Ωcm |
| Middle | $2.58 \times 10^{16}$ atom/cm$^3$ | $8.07 \times 10^{15}$/cm$^3$ | $3.59 \times 10^{11}$ Ωcm |
| Bottom | $3.24 \times 10^{16}$ atom/cm$^3$ | $1.87 \times 10^{16}$/cm$^3$ | $1.19 \times 10^{10}$ Ωcm |

TABLE 2

Comparative Example 1

| | Uncompensated impurity concentration | Vanadium concentration | Room temperature resistivity |
|---|---|---|---|
| Top | $5.95 \times 10^{17}$ atom/cm$^3$ | $3.80 \times 10^{15}$/cm$^3$ | $9.54 \times 10^{-1}$ Ωcm |
| Middle | $7.22 \times 10^{17}$ atom/cm$^3$ | $8.06 \times 10^{15}$/cm$^3$ | $1.10 \times 10^{-1}$ Ωcm |
| Bottom | $2.40 \times 10^{18}$ atom/cm$^3$ | $9.97 \times 10^{15}$/cm$^3$ | $4.36 \times 10^{-2}$ Ωcm |

TABLE 3

Comparative Example 2

| | Uncompensated impurity concentration | Vanadium concentration | Resistivity |
|---|---|---|---|
| Top | $1.24 \times 10^{16}$ atom/cm$^3$ | Less than $5.0 \times 10^{14}$/cm$^3$ | $5.72 \times 10^2$ Ωcm |
| Middle | $2.19 \times 10^{16}$ atom/cm$^3$ | Less than $5.0 \times 10^{14}$/cm$^3$ | $3.58 \times 10^2$ Ωcm |
| Middle | $2.73 \times 10^{16}$ atom/cm$^3$ | Less than $5.0 \times 10^{14}$/cm$^3$ | $2.17 \times 10^2$ Ωcm |

TABLE 4

Comparative Example 3

| | Uncompensated impurity concentration | Vanadium concentration | Room temperature resistivity |
|---|---|---|---|
| Top | $5.75 \times 10^{17}$ atom/cm$^3$ | Less than $5.0 \times 10^{14}$/cm$^3$ | $1.02 \times 10^{-1}$ Ωcm |
| Middle | $6.83 \times 10^{17}$ atom/cm$^3$ | Less than $5.0 \times 10^{14}$/cm$^3$ | $5.78 \times 10^{-1}$ Ωcm |
| Bottom | $2.46 \times 10^{18}$ atom/cm$^3$ | Less than $5.0 \times 10^{14}$/cm$^3$ | $4.24 \times 10^{-2}$ Ωcm |

Example 2

Next, an example of the process of purification treatment of the graphite crucible in advance, then crystal growth will be explained. First, a system without the seed crystal and sublimating material of FIG. 1 was used for purification treatment of the graphite crucible. The graphite crucible 3 and lid 4 were covered by the felt 7 and placed inside a double wall quartz pipe 5, the inside of the quartz pipe was evacuated to less than $1.0\times10^{-4}$ Pa, then current was run through the work coil 8 while continuing evacuation so as to raise the temperature of the graphite crucible and lid to 2500° C. The purification treatment time was 20 hours. During that time, the vacuum evacuation system 11 was continuously operated to maintain the internal pressure of the quartz pipe at a value lower than the purification treatment pressure of $1.3\times10^{-2}$ Pa. After the end of the purification treatment, the graphite crucible 3 and lid 4 were cooled and taken out from the double wall quartz pipe 5 inside a vacuum glove box filled with an inert gas so as to prepare for crystal growth without exposing the crucible to the atmosphere.

As the seed crystal 1, an SiC single crystal wafer having a size of 50 mm, having an (0001) face, and made of a single 6H polytype was attached to the inside surface of the lid 4. A commercially available SiC crystal powder and vanadium compound in mixture were filled into the graphite crucible 3 as a sublimating material 2. The vanadium compound was mixed in an amount giving, by vanadium atom conversion, a mass concentration in the sublimating material of 0.032%. The crucible filled with the material was closed by the lid 4 and again placed inside the double wall quartz pipe 5 where the crystal was grown by the next process. The inside of the quartz pipe was evacuated to $1.0\times10^{-4}$ Pa, then high purity Ar gas of a purity of 99.9999% or more was run through it. While maintaining the pressure inside the quartz pipe at the growth pressure of $1.3\times10^3$ Pa, current was run through the work coil 8 to raise the temperature of the graphite crucible to 2400° C. After this, growth was continued for about 20 hours. At this time, the temperature gradient inside the crucible was 14.5 to 15.5° C./cm and the growth rate was about 0.8 mm/hour. The obtained crystal had a size of about 52 mm and a height of about 16 mm.

Before evaluating the crystal, for the purpose of confirming the effect of the graphite crucible purification treatment, the nitrogen concentration of a graphite crucible treated under the same conditions as the purification treatment of Example 1 was measured by the inert gas fusion thermal conductivity method. The measurement was performed by a similar method as in the above-mentioned Example 1. The nitrogen concentration was about 7 ppm.

The thus obtained silicon carbide single crystal was analyzed by X-ray diffraction and Raman scattering, whereby it was confirmed than an SiC single crystal having a main polytype of 6H was grown. Three wafers having orientations of exactly the (0001) face corresponding to the top, middle, and bottom of the grown crystal (distances from the surface of the start of growth of the seed crystal of 12 mm, 8 mm, and 4 mm) were prepared and analyzed in the same way as in Example 1. The results are shown in Table 5.

The main impurity of the crystal of Example 2 (Table 5) was nitrogen, and the impurity conductivity was the n type. The crucible purification treatment caused the nitrogen concentration to be greatly reduced. As a result, the uncompensated impurity concentration fell to $9.76 \times 10^{15}$ to $3.01 \times 10^{16}$/cm$^3$. On the other hand, the room temperature resistivity became a high value of $1 \times 10^{10}$ Ωcm or more.

TABLE 5

Example 2

|  | Uncompensated impurity concentration | Vanadium concentration | Room temperature resistivity |
|---|---|---|---|
| Top | $9.76 \times 10^{15}$ atom/cm$^3$ | $4.75 \times 10^{15}$/cm$^3$ | $4.12 \times 10^{12}$ Ωcm |
| Middle | $1.26 \times 10^{16}$ atom/cm$^3$ | $8.92 \times 10^{15}$/cm$^3$ | $6.60 \times 10^{11}$ Ωcm |
| Bottom | $3.01 \times 10^{16}$ atom/cm$^3$ | $1.97 \times 10^{16}$/cm$^3$ | $4.74 \times 10^{10}$ Ωcm |

Example 3

Next, an example of production of an SiC signal crystal of the present invention having a size of 100 mm or more will be explained. In Example 3 as well, the crystal growth system of FIG. 1 was used for the production. As the seed crystal 1, an SiC single crystal wafer having a size of 100 mm and (0001) face and made of a single 4H polytype was attached to the inside surface of the graphite lid 4. The sublimating material 2, like in Example 1, was comprised of commercially available SiC crystal powder and a vanadium compound in mixture. The vanadium compound was mixed in by an amount giving, by vanadium atom conversion, a mass concentration in the sublimating material of 0.042%. Next, the crucible 3 filled with the material was closed by a graphite lid 4 equipped with the seed crystal, covered by graphite felt 7, then placed on a graphite support rod 6 and set inside a double wall quartz pipe 5 for crystal growth by a crystal growth process including graphite crucible purification treatment. The details were as follows:

First, the inside of the quartz pipe 5 was evacuated to less than $1.0 \times 10^{-4}$ Pa, then, while continuing to evacuate it, current was run through the work coil 8 to raise the temperature of the graphite crucible to the purification treatment temperature of 1600° C. At this time, the internal pressure of the quartz pipe temporarily rose to 1.3 Pa or more, but while holding the temperature as is, the quartz pipe was evacuated to an internal pressure of the purification treatment pressure of $1.0 \times 10^{-1}$ Pa or less whereupon treatment was begun to remove the impurity nitrogen in the crucible. The treatment time was 72 hours. During that interval, the vacuum evacuation system 11 was operated to maintain the internal pressure of the quartz pipe at a value lower than the above-mentioned value. After the end of the crucible purification treatment, as the atmospheric gas, high purity Ar gas of a purity of 99.9999% or more was run through the pipe 9 under the control of an Ar gas mass flow controller 10 and, while maintaining the pressure in the quartz pipe at the growth pressure of $1.3 \times 10^3$ Pa, the graphite crucible temperature was raised to the target temperature of 2400° C. Thereafter, growth was continued for about 20 hours. The temperature gradient in the crucible at this time was 14.5 to 15.5° C./cm, and the growth rate was about 0.8 to 0.9 mm/hour. The obtained crystal had a size of about 100 mm and a height of about 15 mm.

Before evaluating the crystal, the nitrogen concentration of the graphite crucible treated under the same conditions as the purification treatment of Example 3 was measured by the inert gas fusion thermal conductivity method. The measurement was conducted by a method similar to the above-mentioned Example 1, whereby the nitrogen concentration was found to be about 8 ppm.

Figure 2:
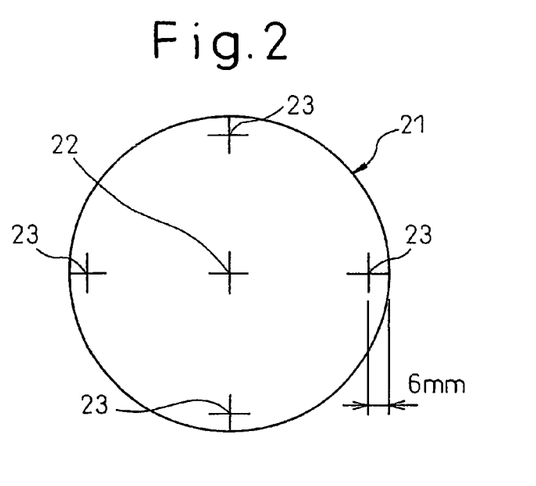
FIG. 2 is a view of the analysis positions of an SiC single crystal wafer of a size of 100 mm.

The thus obtained SiC single crystal was analyzed by X-ray diffraction and Raman scattering, whereby it could be confirmed that an SiC single crystal of a mainly 4H polytype was grown. Three wafers having orientations of exactly the (0001) face corresponding to the top, middle, and bottom of the grown crystal (distances from the surface of the start of growth of the seed crystal of 12 mm, 8 mm, and 4 mm) were prepared and analyzed in the same way as in Example 1. For Example 3, for the purpose of examining the planar distribution of the properties, as shown in FIG. 2, the analysis was conducted for a total of five points including the wafer center and four points around it. The results of analysis of the center and, as the maximum value of the fluctuation, the maximum value of the |analysis value of the center−analysis value of the surroundings|, are shown in Table 6.

The main impurity of the crystal of Example 3 (Table 6) was nitrogen, and the impurity conductivity was the n type. Along with the larger size of the ingot, the volume of the crucible also became larger, so in a crucible with no purification treatment, the amount of nitrogen produced would increase, but in Example 3, the purification treatment enables the nitrogen of the crucible to be greatly reduced. As a result, the grown SiC single crystal had an uncompensated impurity concentration at the wafer center of a low value of $8.97 \times 10^{15}$ to $3.54 \times 10^{16}$/cm$^3$. While both the uncompensated impurities and vanadium exhibited some differences of concentration in the planes, high room temperature resistivity of $1 \times 10^{10}$ Ωcm or more was obtained at the entire surface of the wafer.

TABLE 6

Example 3

|  |  | Uncompensated impurity concentration | Vanadium concentration | Room temperature resistivity |
|---|---|---|---|---|
| Top | Middle | $1.76 \times 10^{16}$ atom/cm$^3$ | $4.02 \times 10^{15}$/cm$^3$ | $3.11 \times 10^{11}$ Ωcm |
|  | Maximum value of fluctuation | $8.63 \times 10^{15}$ atom/cm$^3$ | $3.43 \times 10^{14}$/cm$^3$ | $7.00 \times 10^9$ Ωcm |

TABLE 6-continued

Example 3

| | | Uncompensated impurity concentration | Vanadium concentration | Room temperature resistivity |
|---|---|---|---|---|
| Middle | Middle | $2.52 \times 10^{16}$ atom/cm$^3$ | $8.22 \times 10^{15}$/cm$^3$ | $4.21 \times 10^{11}$ Ωcm |
| | Maximum value of fluctuation | $4.14 \times 10^{15}$ atom/cm$^3$ | $2.80 \times 10^{14}$/cm$^3$ | $8.50 \times 10^{10}$ Ωcm |
| Bottom | Middle | $3.54 \times 10^{16}$ atom/cm$^3$ | $1.94 \times 10^{16}$/cm$^3$ | $1.24 \times 10^{10}$ Ωcm |
| | Maximum value of fluctuation | $3.33 \times 10^{15}$ atom/cm$^3$ | $3.60 \times 10^{15}$/cm$^3$ | $1.10 \times 10^{9}$ Ωcm |

Example 4

Next, an SiC single crystal ingot produced by the same process as in Example 3 was used to fabricate a mirror surface wafer having an orientation 4 degrees off from the (0001) face in the <11-20> direction, a size of 100 mm, and a thickness of 360 μm. This mirror surface wafer was used as a substrate for SiC epitaxial growth. The growth conditions of the SiC epitaxial thin film were a growth temperature of 1500° C. and flow rates of silane (SiH$_4$), propane (C$_3$H$_8$), and hydrogen (H$_2$) of $5.0 \times 10^{-9}$ m$^3$/sec, $3.3 \times 10^{-9}$ m$^3$/sec, and $5.0 \times 10^{-5}$ m$^3$/sec. The growth pressure was made the atmospheric pressure. The growth time was 2 hours, whereupon the film grew to a thickness of about 5 μm. The thus obtained epitaxial thin film was examined under a Normalsky optical microscope, whereupon it could be confirmed that a high quality SiC epitaxial thin film having very few pits and other surface defects over the entire wafer surface and having a good surface morphology was formed.

Example 5

Further, another SiC single crystal ingot produced by a process similar to Example 3 was used to fabricate a mirror surface wafer having an orientation of exactly the (0001) face, a size of 100 mm, and a thickness of 360 μm. This mirror surface wafer was used as a substrate for epitaxial growth of a gallium nitride thin film by the metal-organic chemical vapor deposition method (MOCVD method). The growth conditions of a gallium nitrogen thin film were a growth temperature of 1050° C. and flow rates of trimethyl gallium (TMG), ammonia (NH$_3$), and silane (SiH$_4$) of $54 \times 10^{-6}$ mol/min, 4 L/min, and $22 \times 10^{-11}$ mol/min. The growth pressure was set to atmospheric pressure. By 60 minutes growth, an n type gallium nitride was grown to a thickness of about 3 μm. The thus obtained epitaxial thin film was observed under a Normalsky optical microscope, whereupon it could be confirmed that a high quality gallium nitride epitaxial thin film having an extremely smooth morphology was formed over the entire surface of the wafer.

Finally, Table 7 will be used to explain the effects of the present invention. Table 7 arranges the above-mentioned Example 1 and Comparative Examples 1 to 3 by vanadium concentration and impurity concentration in the crystal. As shown in Table 7, only Invention Example 1 exhibits the targeted high resistivity. The present invention, which aims at the complex effect of vanadium and deep level defects, gives special effects far greater than anticipated from the effects when using these alone and the differences between Comparative Examples 1 and 3 or Comparative Examples 2 and 3.

TABLE 7

Comparison of Effects

| | Vanadium concentration | |
|---|---|---|
| Uncompensated impurity concentration | $1.0 \times 10^{15}$ atoms/cm$^3$ or more, less than uncompensated impurity concentration | Less than $5.0 \times 10^{14}$ atoms/cm$^3$ |
| $1.0 \times 10^{17}$ atoms/cm$^3$ or less | Invention Example 1 bulk resistivity $>1 \times 10^{10}$ Ωcm | Comparative Example 2 bulk resistivity $<1 \times 10^{3}$ Ωcm |
| $1.0 \times 10^{17}$ atoms/cm$^3$ or more | Comparative Example 1 bulk resistivity $<1 \times 10^{0}$ Ωcm | Comparative Example 3 bulk resistivity $<1 \times 10^{0}$ Ωcm |

INDUSTRIAL APPLICABILITY

As explained above, according to the present invention, a high resistivity, high crystal quality SiC single crystal and SiC single crystal wafer can be provided. Further, according to the method of production of the present invention, it is possible to keep down the rise in manufacturing costs and produce the above SiC single crystal at a high yield.

The invention claimed is:

1. A method of production of a silicon carbide single crystal, comprising:
   sublimation recrystallization of a sublimating material onto a seed crystal comprising silicon carbide in a graphite crucible, thereby growing a single crystal containing an uncompensated impurity in a concentration of at least $1 \times 10^{15}$/cm$^3$ and not more than $1 \times 10^{17}$/cm$^3$ and containing vanadium in a concentration of less than the concentration of said uncompensated impurity; wherein the difference in concentrations of said uncompensated impurity and said vanadium is such that said single crystal has an electrical resistivity at room temperature of at least $1.19 \times 10^{10}$ Ωcm,
   wherein the graphite crucible has a nitrogen concentration of not more than 50 ppm as measured by an inert gas fusion thermal conductivity method, and
   the sublimating material comprises a mixture of silicon carbide and vanadium or a mixture of silicon carbide and a vanadium compound.

2. The method of production of a silicon carbide single crystal as set forth in claim 1, wherein the graphite crucible has a nitrogen concentration of not more than 20 ppm.

3. The method of production of a silicon carbide single crystal as set forth in claim 1, wherein the graphite crucible has a nitrogen concentration of not more than 10 ppm.

4. The method of production of a silicon carbide single crystal as set forth in claim 1, further comprising holding the graphite crucible in an inert gas atmosphere at a pressure of not more than 1.3 Pa at a temperature of 1400° C. or more for 10 hours to less than 120 hours.

5. The method of production of a silicon carbide single crystal as set forth in claim 1, further comprising charging the graphite crucible with a powder comprising silicon carbide and, holding the graphite crucible and silicon carbide powder in an inert gas atmosphere at a pressure of not more than 1.3 Pa at a temperature of 1400 to 1800° C. for 10 hours to less than 120 hours, placing a seed crystal in the graphite crucible, adding the sublimating material to the graphite crucible, heating the graphite crucible, sublimating material, and seed crystal in an inert gas atmosphere at a pressure of $1.3 \times 10^2$ to $1.3 \times 10^4$ Pa at 2000° C. or more, and then starting crystal growth.

6. The method of production of a silicon carbide single crystal as set forth in claim 4, wherein the pressure is $1.3 \times 10^{-1}$ Pa or less.

7. The method of production of a silicon carbide single crystal as set forth in claim 4, wherein the pressure is $6.5 \times 10^{-2}$ Pa or less.

8. The method of production of a silicon carbide single crystal as set forth in claim 4, wherein after heating the crucible in an inert atmosphere, the graphite crucible is used for crystal growth without being exposed to the atmosphere.

\* \* \* \* \*

UNITED STATES PATENT AND TRADEMARK OFFICE
CERTIFICATE OF CORRECTION

PATENT NO. : 8,491,719 B2
APPLICATION NO. : 12/455243
DATED : July 23, 2013
INVENTOR(S) : Masashi Nakabayashi et al.

It is certified that error appears in the above-identified patent and that said Letters Patent is hereby corrected as shown below:

In the Specification

Column 3, line 65, change "The inventors engages" to -- The inventors engage --;

Column 4, line 15, change "(1)(to (3))," to -- (1) to (3), --;

Column 10, line 63, change "1 × 100 Ωcm" to -- $1 \times 10^0$ Ωcm --.

Signed and Sealed this
Fifth Day of August, 2014

Michelle K. Lee
*Deputy Director of the United States Patent and Trademark Office*